US010573529B2

(12) United States Patent
Posseme et al.

(10) Patent No.: US 10,573,529 B2
(45) Date of Patent: Feb. 25, 2020

(54) METHOD OF ETCHING A THREE-DIMENSIONAL DIELECTRIC LAYER

(71) Applicant: COMMISSARIAT A L'ENERGIE ATOMIQUE ET AUX ENERGIES ALTERNATIVES, Paris (FR)

(72) Inventors: Nicolas Posseme, Sassenage (FR); Sebastien Barnola, Villard Bonnot (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/233,948

(22) Filed: Dec. 27, 2018

(65) Prior Publication Data
US 2019/0214266 A1 Jul. 11, 2019

(30) Foreign Application Priority Data
Dec. 27, 2017 (FR) .................. 17 63234

(51) Int. Cl.
*H01L 21/311* (2006.01)
*H01L 29/66* (2006.01)

(52) U.S. Cl.
CPC .. *H01L 21/31116* (2013.01); *H01L 29/66795* (2013.01)

(58) Field of Classification Search
CPC .............................................. H01L 21/31116
See application file for complete search history.

(56) References Cited

U.S. PATENT DOCUMENTS

| 9,548,379 B1 * | 1/2017 | Basker ............... H01L 29/7835 |
| 2013/0252430 A1 | 9/2013 | Ramjan et al. |
| 2016/0079396 A1 | 3/2016 | Posseme et al. |

FOREIGN PATENT DOCUMENTS

EP 2 998 998 A1 3/2016

OTHER PUBLICATIONS

French Preliminary Search Report dated Oct. 5, 2018 in French Application 17 63234, filed on Dec. 27, 2017 (with English translation of categories of cited documents & Written Opinion).

* cited by examiner

*Primary Examiner* — Roberts P Culbert
(74) *Attorney, Agent, or Firm* — Oblon, McClelland, Maier & Neustadt, L.L.P.

(57) ABSTRACT

A method for etching a dielectric layer covering at least one top and at least one flank of a semi-conductive material-based structure is provided, including a plurality of sequences, each including successive steps of: a first etching of the layer by plasma using a chemistry including at least a first fluorine-based compound and a second compound chosen from $Si_wCl_{(2w+2)}$ and $Si_wF_{(2w+2)}$, w, x, y, and z being whole numbers, and oxygen, the first etching: interrupting before complete consumption of the dielectric layer thickness on the flank and after complete consumption of the thickness on the top, and forming a first protective layer on the top and a second protective layer on the flank; and a second etching fully removing the second layer while conserving a portion of the first layer thickness, each sequence being repeated until complete removal of the dielectric layer on the flank.

19 Claims, 4 Drawing Sheets

METHOD OF ETCHING A THREE-DIMENSIONAL DIELECTRIC LAYER

TECHNICAL FIELD OF THE INVENTION

The present invention generally relates to the etching of layers on microelectronic structures, in particular three-dimensional (3D).

It has a particularly advantageous application in producing FinFET-type transistors, i.e. field-effect transistors (FET) of which the conduction channel comprises a thin vertical strip of a semi-conductive material, qualified by the term, "fin".

STATE OF THE ART

In the long-standing trend of reducing dimensions which characterises the whole microelectronics industry, a particular difficulty consists of precisely etching a layer situated on some or on all of the faces of a 3D structure without damaging or consuming the 3D structure.

Such is, for example, the case for the dielectric layer intended to form the spacers of a grid of a FinFET-type transistor, and which is deposited on the Fins of the transistors as will be explained below.

A FinFET-type transistor 100 is illustrated in FIG. 1. In this three-dimensional device, the conduction channel 110 is constituted of a thin vertical strip of semi-conductive material, typically silicon. The strip forming the channel 110 is surrounded on three sides by the grid 130. The strip passes through either side of the grid 130 and extends to form either side of the grid 130 of the "Fins" 30. These Fins thus constitute three-dimensional (3D) structures.

With respect to conventional transistors, these FinFET devices make it possible to obtain transistors having better electrical performances and also to reduce the current leakages. The FinFET device above can be produced from an SOI substrate of which the BOX 20 embedded protective layer and the support substrate 10 are located. The presence of a hard mask 150 at the top of the grid 130 will also be noted.

The FinFET device 100 requires that it is known to produce spacers 140 in the flanks of the grid 130. These spacers 140 in particular have the function of protecting the flanks of the grid 130 during subsequent implantation phases.

To form these spacers 140, first a deposition of an even layer of a dielectric material is made on all the surfaces of the device 100.

As is illustrated in FIG. 1, it must be able to be obtained by etching, that only spacers 140 perpendicular to the plane of the substrate 10 remain in place on either side of the grid 130. All the other surfaces, in particular those covering the Fin 30, whether they are perpendicular or parallel to the plane XY of the substrate 10, must be completely etched. This must be done without leaving residue 160 of dielectric layer on the BOX 20 and without damaging the layers underlying the etched dielectric layer, typically without damaging 180 the top 31 of the Fins 30 or without damaging 190 the upper face of the BOX 20. Moreover, it is important to obtain a perfectly anisotropic etching in the angles 170 without forming feet, this in order to conserve right angles.

To meet this need, the conventional solution consists of using a plasma etching to etch the dielectric layer. If the plasma etching has permitted to support reductions in size of the patterns up to now, the implementation thereof however poses more and more problems when the size decreases, in particular from and beyond the technological node by 32 nm. The three-dimensional (3D) character of the FinFET structure means that the problems already encountered with a flat structure are posed with even more acuity.

In particular, it is particularly complex to fully etch the dielectric layer 40 on the top 31 and the flanks 32 of the Fin 30 without damaging the Fin 30 or leaving residue of the dielectric layer 40.

There is therefore a need consisting of proposing a solution to fully etch and with a great precision, a dielectric layer situated on the faces of a 3D structure while avoiding damaging this 3D structure.

In the specific and non-limiting scope of the FinFET-type transistors, an aim of the present invention consists of proposing a solution to etch on the Fins, the dielectric layer intended to form spacers on the flanks of the grid, while avoiding, even by removing, the residue of the dielectric layer on either side of the Fins, as well as the consumption of layers underlying the dielectric layer, such as the semi-conductive layer forming the Fin.

Other aims, characteristics and advantages of the present invention will appear upon examining the following description and supporting drawings. It is understood that other advantages can be incorporated.

SUMMARY OF THE INVENTION

To achieve this aim, according to an embodiment of the present invention provides a method for etching a dielectric layer covering at least one top and one flank of a preferably semi-conductive material-based structure.

The method comprises a plurality of sequences, each comprising at least the following successive steps:
a first etching of the dielectric layer, by plasma, by using a chemistry comprising at least:
at least one first fluorine (F)-based compound and
at least one second compound taken from among $Si_wCl_{(2w+2)}$ and $Si_wF_{(2w+2)}$ w, x, y and z being whole numbers,
oxygen (O).
the first etching being done so as to:
generating an ionic bombardment directly mainly along a direction parallel to said flank,
adjusting the quantity of the at least one first compound to consume the whole fluorine-based compound during this first etching so as to interrupt the first etching before consumption, along the favoured direction of the bombardment, of all the thickness of the dielectric layer situated on the flank and after having consumed all the thickness of the dielectric layer situated on the top,
forming a first protective layer by oxidising an upper portion of the top of the structure made of a semi-conductive material and forming a second protective layer by oxidising an upper portion of the dielectric layer situated on the flank, the thickness $e_{50a}$ of the first protective layer being greater than the thickness $e_{60a}$ of the second protective layer,
a second etching to fully remove the second protective layer while conserving a portion $e_{50b}$ of the thickness of the first protective layer.

Advantageously, the sequence is repeated until the complete removal of the dielectric layer situated on the flank of the structure.

Thus, the present invention proposes an effective solution to fully etch and with a great precision, the dielectric layer on the top and the faces of a 3D structure while avoiding damaging this 3D structure.

Typically, the etching is such that the stopping on the atomic scale silicon layer can be controlled.

Indeed, the chemistry used during the first etching, combining fluorinated species and at least silicon-based gas makes it possible to effectively etch the dielectric layer, with a strong selectivity with respect to the semi-conductive material of the 3D structure. Moreover, this etching is interrupted, when all the fluorinated species is consumed, before etching the semi-conductive material of the 3D structure. The presence of oxygen in the plasma leads to the formation of a protective layer of which the thickness is thicker on the semi-conductive material of the 3D structure than on the dielectric layer.

The second etching makes it possible to remove the protective layer on the dielectric layer, while conserving this protective layer on the semi-conductive material. During the first etching of the following sequence, the semi-conductive material will therefore be protected by the residue of the first protective layer which will prevent the etching of the latter, while the dielectric layer will no longer be protected by the second protective layer. The dielectric layer, exposed, will therefore be easily etched.

By repeating this step sequence, the dielectric layer is thus quickly etched while consuming very, very little, even without consuming the semi-conductive material of the 3D structure.

When the 3D structure is intended to form a FinFET-type transistor, the present invention thus proposes an effective solution to etch the dielectric layer deposited on the Fins, while avoiding, even while removing, the residue of the dielectric layer outside of the Fins, as well as consuming layers underlying the dielectric layer such as the semi-conductive layer forming the Fin.

The solution proposed by the present invention has numerous advantages.

In particular, in the scope of development of the present invention, it has proven to be that conventional solutions of etching silicon nitride (SiN) spacers which are based on the use of fluorocarbon chemistry (FC) very often induce a non-desired consumption (usually qualified as a "recess") of silicon forming the Fin of the FinFET transistor.

Indeed, it has been noticed that the FC etching of the dielectric layer induces, in addition to a silicon consumption, a modification of a superficial portion of the silicon layer. This superficial portion is transformed into a SixOyFz layer which is found removed during the etching or after the etching during the wet cleaning step. Moreover, this modified superficial portion induces defects during the epitaxial growth.

Moreover, to reduce this excessive consumption of silicon forming a recess, it has been considered to adjust the conditions of implanting ions coming from the plasma. In a conventional plasma, the minimum energy of the ions is around 20 eV. With this energy level, significant damage to the layer exposed to the plasma is observed. A solution which can possibly be considered by a person skilled in the art in order to limit this damage would consist of reducing the temperature Te of the electrons, which would lead to reducing the potential of the plasma, and consequently reducing the energy of the ions. Another solution which can possibly be considered by a person skilled in the art would consist of using a pulsed plasma. However, these two solutions are not satisfactory or are only partially satisfactory, since:

a reduction of the temperature of the plasma leads to expanding the angle of distribution of the ions, thus reducing the anisotropic character of the etching is ultimately damaging the dimensional control of the profile of the 3D structure, the use of a pulsed plasma does not make it possible to completely remove the damaging of the layer underlying the dielectric layer that is desired to be etched.

Thus, at best, a person skilled in the art would have had at their disposition, solutions obligating it to make a compromise between damaging the underlying layer and dimensional control of the profile.

Another aspect of the present invention relates to a method for producing a FinFET transistor surmounting a support substrate, the FinFET transistor comprising a grid and at least one channel passing through the grid and extending from a flank of the grid to form at least one structure, preferably made of a semi-conductive material, said structure having a top and at least two flanks.

The method comprises:

the deposition, preferably conform, of a dielectric layer covering the grid and said structure, the etching of the dielectric layer by implementing the method according to any one of the embodiments of the etching method according to the invention, so as to completely remove the dielectric layer situated on the structure formed by the channel.

Optionally, the method for producing a FinFET transistor can comprise at least any one of the following characteristics taken individually or in combination:

According to an embodiment example, the transistor has a hard mask covering a top of the grid, the dielectric layer being deposited on the hard mask, the hard mask having a thickness $e_{150}$, such that $e_{150} \geq e_{30}$, $e_{30}$ being the thickness of said structure, and preferably $e_{150} \geq 1.2 \ast e_{30}$.

Thus, when the etching fully consumes the dielectric layer situated on the flanks of the structure, all the height of the flanks of the grid remains covered by the dielectric layer. Consequently, the removal of the dielectric layer on the flanks of the Fin does not lead to the removal of this dielectric layer on the flanks of the grid. The latter therefore remain effectively protected by the spacers.

According to an embodiment example, the thicknesses of the hard mask and of the structure are taken along the directions perpendicular (Z) to the main plane (XY), wherein extends the support substrate.

Another aim of the present invention relates to a microelectronic device comprising a plurality of FinFET transistors according to the invention. By microelectronic device, this means any type of device produced with microelectronic means. These devices in particular comprise, in addition to devices for a purely electronic purpose, micromechanical or electromechanical devices (MEMS, NEMS, etc.), as well as optical or optoelectronic devices (MOEMS, etc.).

BRIEF DESCRIPTION OF THE FIGURES

The aims, objectives, as well as the characteristics and advantages of the invention will best emerge from the detailed description of embodiments of the latter, which are illustrated by the following supporting drawings, wherein.

Figure 1:
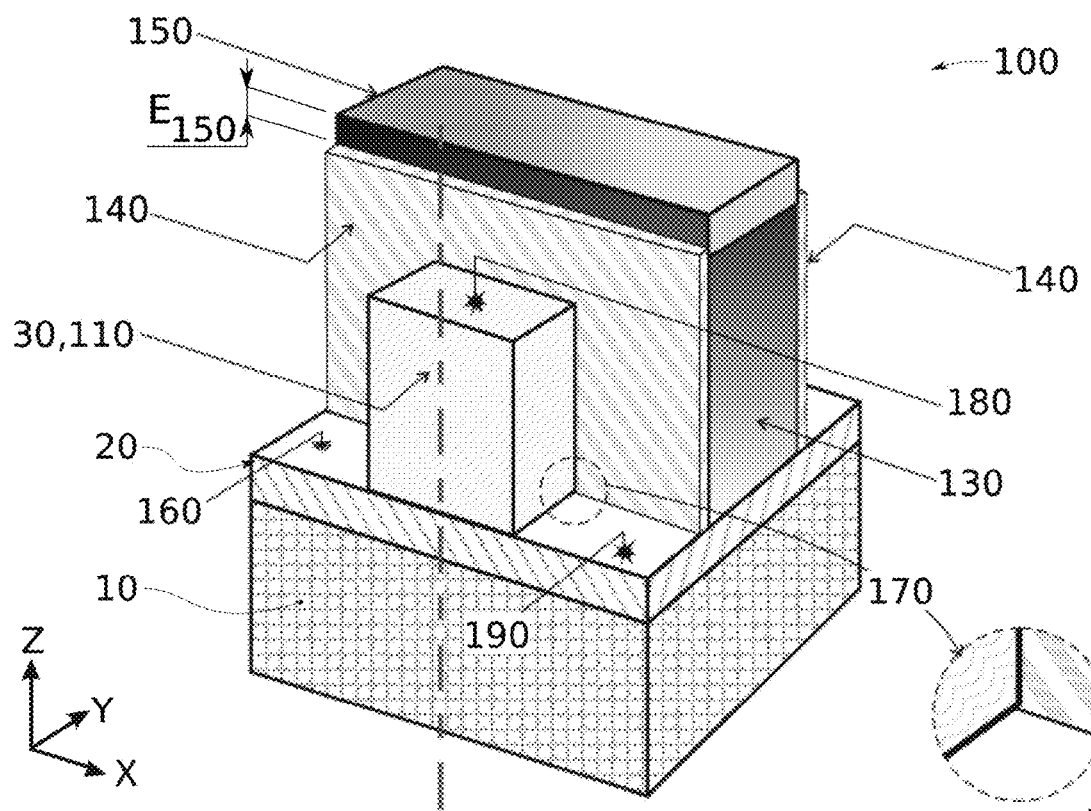
FIG. 1 schematically illustrates a FinFET-type transistor.

The drawings are given as examples, and are not limiting of the invention. They constitute schematic representations of principle intended to facilitate the understanding of the invention and are not necessarily to the scale of practical applications. In particular, the relative thicknesses of the different layers and films are not representative of reality.

DETAILED DESCRIPTION OF THE INVENTION

Before starting a detailed review of embodiments of the invention, are stated below of the optional characteristics which can possibly be used in association or alternatively:

According to an embodiment example, the method comprises a prior step of depositing said dielectric layer on said structure. Preferably, the deposition of said dielectric layer is a conform deposition.

According to an embodiment example, the method comprises a prior step of etching the dielectric layer, carried out before said step sequence, the prior etching step being interrupted so as to conserve a portion of the dielectric layer situated on the top of the structure made of a semi-conductive material.

According to an embodiment example, the prior step of etching the dielectric layer is based on a fluorocarbon chemistry (for example, CxFy or CxHyFz).

Below in the description, it is considered that fluorocarbon chemistries in particular comprise fluorocarbon compounds ($C_xF_z$) and hydrofluorocarbon compounds ($C_xH_yF_z$).

According to an embodiment example, the prior etching step is interrupted by controlling the etching time, such that the etched thickness $e_{11}$ of the dielectric layer during this prior step is such that $0.95*e_{10} \geq e_{11} \geq 0.7*e_{10}$, $e_{10}$ being the thickness of the dielectric layer before etching by said prior step.

Thus, this step makes it possible to etch a significant portion of the dielectric layer. It makes it possible to increase the speed of the method.

According to an embodiment example, $e_{10} \geq 6$ nm and preferably $e_{10} \geq 8$ nm.

According to an embodiment example, said portion of the dielectric layer conserved from the prior etching step has a thickness $e_{12}$ greater than or equal to 2 nm ($2*10^{-9}$ meters) and preferably between 2 and 20 nm.

This step thus makes it possible to remove a part of the thickness of the dielectric layer while ensuring that the structure made of a semi-conductive material is not etched or altered.

According to an embodiment example, said first fluorine (F)-based compound of the chemistry used for the first etching step originates, preferably fully, from the chemistry used during said prior etching step.

Alternatively, one part at least and optionally the whole first fluorine (F)-based compound of the chemistry used for the first etching step is provided during the first etching step.

According to an embodiment example, the first fluorine (F)-based compound originates from the dissociation of at least one compound taken from among fluorocarbon compounds (for example, $C_xF_z$ or $C_xH_yF_z$).

According to an embodiment example, the second etching is a fluorinated or fluorocarbon chemistry-based etching (for example, $C_xF_z$ or $C_xH_yF_z$).

According to an embodiment example, the second etching is time-controlled, so as to fully remove the second protective layer and to conserve a part $e_{50b}$ of the thicknesses $e_{50a}$ of the first protective layer.

Thus, during a subsequent etching, the top remains protected by the first protective layer while the flank it itself not protected. The latter can thus be easily etched.

According to an embodiment example, said structure is three-dimensional (3D).

According to an embodiment example, the structure made of a semi-conductive material is made of a material taken from among the following materials: silicon (Si), germanium (Ge), silicon-germanium (SiGe). The structure made of a semi-conductive material can also be made of a succession of layers, each layer being, for example, taken from among the following materials: silicon (Si), germanium (Ge), silicon-germanium (SiGe). Thus, to produce nanowires, a succession of layers, each formed of Si or of SiGe can be provided.

According to an embodiment example, the structure made of a semi-conductive material forms a channel of a FinFET transistor.

According to an embodiment example, said flank extends along a plane perpendicular (YZ) to a main plane (XY) along which the support substrate extends. Alternatively, said flank defines a curved shape which extends perpendicular to a main plane along which the support substrate extends.

According to an embodiment example, said structure is formed by at least one block or a strip of semi-conductive material. Alternatively, said structure is formed by a layer, possibly conform, having a three-dimensional shape.

According to an embodiment example, the top extends mainly in a plane parallel to the plane (XY) of the support substrate.

According to an embodiment example, said structure comprises first surfaces which are perpendicular to the support substrate plane and second surfaces which are non-perpendicular to said support substrate plane.

According to an embodiment example, the flanks of the structure are perpendicular to the plane XY wherein extends mainly the support substrate. Alternatively, the flanks of the structure are tilted with respect to a direction Z perpendicular to the plane XY wherein extends mainly the support substrate.

According to an embodiment example, the dielectric layer is directly in contact with the structure made of a semi-conductive material.

According to an embodiment example, when the dielectric layer situated on the flank of the structure is fully etched, then a step of removing the first protective layer is carried out.

According to an embodiment example, the flanks extend in planes perpendicular (YZ, ZX) to a base plane (XY) on which the structure rests, the structure having at least one face, typically a top, having, projecting along a direction perpendicular (Z) to the base plane (XY), a non-zero surface.

At least one and preferably each step sequence comprises, after the first etching and before the second etching, an oxidation, called main oxidation, leading to the formation of an oxide film on the exposed surfaces.

According to an example, the main oxidation is done such that the oxide film has at least:
first portions formed on the surface of the dielectric layer covering the at least one flank, the first portions extending in a plane perpendicular (YZ, ZX) to the base plane (XY),
at least one second portion formed on said second protective layer situated on the dielectric layer and having, projecting along the direction perpendicular (Z) to the base plane (XY), a non-zero surface,
at least one third portion formed on the first protective layer and having, projecting along the direction perpendicular (Z) to the base plane (XY), a non-zero surface.
The second etching is done so as to:
have a favoured direction (Z) perpendicular to the base plane (XY),
fully remove said second portion and said second protective layer to uncover, along the direction perpendicular (7) to the base plane (XY), the dielectric layer situated under the second portion,
be stopped before fully consuming said first portions formed on the surface of the dielectric layer covering the at least one flank.

Thus, the oxide film formed on the surface of the dielectric layer covering the flanks prevents any involuntary lateral consumption of the latter. The dielectric layer covering the surfaces perpendicular to the base plane XY is therefore etched perfectly anisotropically, i.e. only along the favoured direction Z. The dimensional control of the thickness of the dielectric layer is therefore considerably improved.

When the 3D structure is intended to form a FinFET-type transistor, the present invention thus proposes an effective solution to etch the dielectric layer deposited on the Fins, while avoiding, even by removing, the residue of the dielectric layer outside of the Fins, as well as the consumption of layers underlying the dielectric layer such as the semiconductive layer forming the Fin.

Moreover, the oxide film formed on the surface of the dielectric layer furthermore makes it possible to preserve the dimensional control of the spacers covering the flanks of the grid.

It is specified that, in the scope of the present invention, the terms "on", "surmounts", "covers", "underlying", "opposite" and the equivalents thereof do not necessarily mean "in contact with". Thus, for example, the deposition, of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers of one same material or of different materials.

By a substrate, a film, a "base" layer of a material A, means a substrate, a film, a layer comprising this material A only or this material A and possibly other materials, for example doping elements.

The "dielectric" word qualifies a material of which the electrical conductivity is sufficiently low in the given application to be used as an insulator.

The term "step" does not compulsorily mean that the actions carried out during a step are simultaneous or immediately successive. Some actions of a first step can in particular be followed by actions connected to a different step, and other actions of the first step can then be revisited.

Thus, the term "step" does not necessarily extend to single and inseparable actions over time and in the phase sequence of the method.

By "type" of a material, this means the chemical composition thereof and/or the crystalline structure thereof. Thus, two layers can be of the same chemical composition but of a different type from a crystallographic viewpoint.

It is specified that in the scope of the present invention, the thickness of a layer or of the substrate is measured along a direction perpendicular to the surface along which this layer or this substrate has the maximum extension thereof.

Except for any indication on the contrary, in the figures, the thickness is taken along the vertical, i.e. along the axis Z.

Likewise, when it is indicated that an element is facing right to another element, this means that these two elements are situated on one same line perpendicular to the main plane of the substrate, or on one same line oriented vertically in the figures.

In the scope of the present invention, by three-dimensional structure, this means a structure forming a protrusion above a layer which itself is underlying such a support substrate or a structure having a profile having at least two discreet height levels or which have a similar profile with a continuous variation of tangents of the shape of the profile.

In the scope of the present invention, a non-limiting, but particularly advantageous example of a 3D structure is a strip (also called a Fin) forming the extension of a FinFET transistor channel.

In reference to FIGS. 2 and 3A to 3F, a non-limiting example of the invention will now be described.

In these figures, the dielectric layer 40 that is desired to be etched, surmounts a three-dimensional structure formed by the Fin 30 of a FinFET transistor 100. All the characteristics, steps and technical advantages which will be described below are applied also to the embodiments wherein the dielectric layer 40 surmounts a three-dimensional structure different from a Fin of a FinFET transistor 100. For example, they are applied to structures forming nanowires and in particular stacked nanowires.

Figure 2:
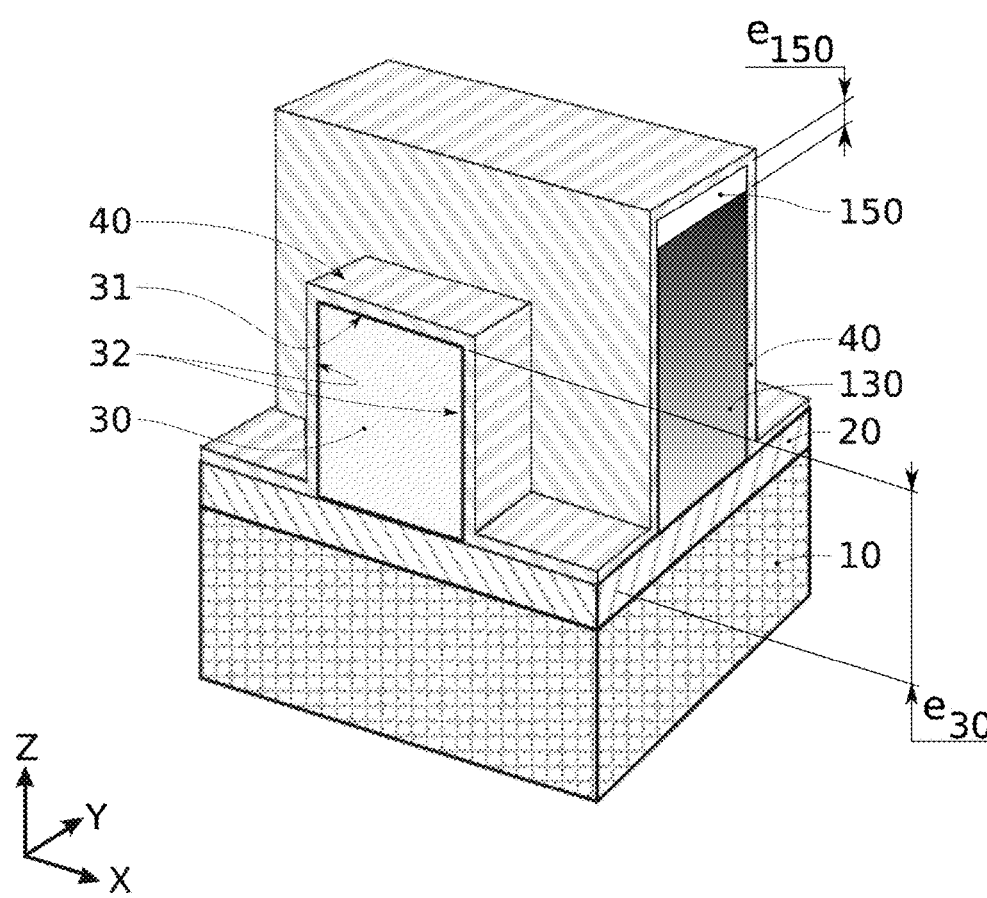
FIG. 2 schematically illustrates a FinFET-type transistor undergoing production, a conform dielectric layer being deposited on all the surfaces of the transistor.

FIG. 2 illustrates a FinFET transistor 100 undergoing production. This structure comprises a support substrate 10, surmounted on an insulating layer 20, typically a BOX embedded oxide layer and with a thin semi-conductive layer. This assembly preferably forms a developed substrate, preferably of a semiconductor-on-insulator type. Naturally, the invention is also applied to a support substrate not having a developed substrate of the semiconductor-on-insulator type.

The structure also comprises a grid 130 stack, which will be named below by the term "grid" for brevity reasons. This grid 130 in particular comprises a grid pattern, usually made of doped silicon or made of metal, a metal layer and an electrically insulating layer called grid oxide situated between the active layer and the grid made of polycrystalline silicon. The grid stack can also comprise a dielectric layer called "high-k", i.e. made of a material with high permittivity. When it is present, this dielectric layer is situated between the grid oxide and the metal grid. For clarity reasons, in FIG. 2, one single block represents all of this stack forming the grid 130. A hard mask 150 surmounts the grid 130. The grid 130 mainly extends in the plane ZX of the orthogonal marker XYZ referenced in FIG. 2.

A pattern passes through the grid 130 throughout, along the axis Y. This pattern generally has a fin shape. It is called a Fin 30. It forms the channel of the transistor, as well as extensions, situated either side of the grid 130, and which are intended to form source and drain zones. This pattern has a top 31 and flanks 32. The flanks 32 extend preferably in a plane YZ perpendicular to the plane XY wherein extends mainly the support substrate 10. In this example, and without this being limiting, the top 31 extends in a plane parallel to the plane XY. Thus, the semi-conductive pattern forms a three-dimensional structure 30. It forms a protrusion over the upper face of the stack of layers comprising the support substrate 10 and the insulating layer 20.

In this example, the structure 20 is made of a semi-conductive material, typically taken from among silicon, silicon-germanium and germanium. The structure 30 can also be made of a Si and SiGe stack, for example when the structure 30 forms a nanowire or a plurality of stacked nanowires.

Figure 3A:
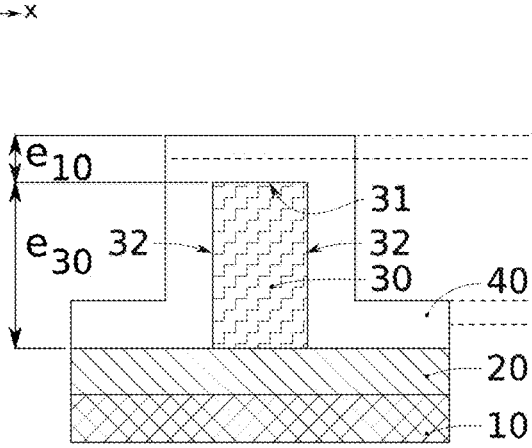
FIG. 3; composed of FIGS. 3A to 3F schematically illustrates steps of a method according to a non-limiting embodiment of the present invention.

FIG. 3A is a cross-sectional view along a plane parallel to the plane ZX is taken at the level of a Fin 30.

The height $e_{30}$ of the Fin 30 is referenced in this FIG. 3A. For example, the height $e_{30}$ of the Fin, measured along the direction Z, is between a few nanometers and a few tens of nanometers. Preferably, $e_{30}$ is between 10 and 150 nanometers and even more preferably, $e_{30}$ is between 20 and 100 nm and even more preferably, $e_{30}$ is between 30 and 50 nm.

As illustrated in FIGS. 2 and 3A, a dielectric layer 40 covers all of the transistor undergoing production. Preferably, this dielectric layer 40 is a conform layer.

In this example connected to FinFET transistors, this dielectric layer 40 is intended to form spacers on the flanks of the grid 130. This dielectric layer 40 is thus formed of materials having a low dielectric constant. This dielectric layer 40 can be porous or not. It is, for example, formed of one of the following materials: SiCO, SiC, SiCN, SiOCN or SiCBN, or a silicon nitride (SixNy, x and y being whole numbers), typically SiN.

Once deposited, this dielectric layer 40 has, for example, a thickness $e_{10}$ of between 4 and 50 nanometers preferably, between 4 and 30 nanometers and preferably between 8 and 12 nanometers. The thickness $e_{10}$ is measured along the direction Z. It is referenced in FIG. 3A.

From the structure illustrated in FIG. 3A, several steps will be implemented with the aim of fully removing the dielectric layer 40 on the top 31 and on the flanks 32 of the Fin 30, as well as on either side of the flanks 32 of the Fin 30, this, without leaving residue of the dielectric layer and without damaging the underlying layers which are the Fin 30 and the insulating layer 20.

This dielectric layer 40 is, for example, formed by one of the following techniques: PECVD (plasma-enhanced chemical vapour deposition), LPCVD (low-pressure CVD), PEALD (plasma-enhanced atomic layer deposition).

Figure 3B:
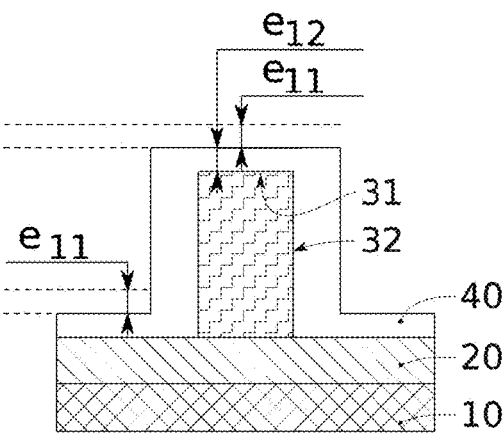

FIG. 3B illustrates a first step. This step is optional. During this step, only one portion of the thickness of the dielectric layer is removed on the zones parallel to the plane XY of the substrate 10.

This removal step mainly comprises an anisotropic etching of the dielectric layer 40. This anisotropic etching makes it possible to increase the speed of the method before subsequent steps which will make it possible for a very precise etching. Typically, during this prior etching step, more than 70% and preferably more than 80% and even more preferably, more than 90% of the initial thickness $e_{10}$ of the dielectric layer 40 is etched. The thickness $e_{11}$ removed during this etching is preferably time-controlled.

Typically, from the etching, the dielectric layer 40 has a residual thickness $e_{12}$ greater than 2 nm, preferably greater than 3 nm and preferably greater than 4 nm. Typically, the residual thickness $e_{12}$ is between 2 and 3 nm. This residual thickness $e_{12}$ makes it possible to avoid, during the etching of the layers underlying the dielectric layer 40, being damaged.

This prior etching step preferably comprises a plasma etching done such that the etching is done along a favoured direction parallel to the flanks of the grid. Thus, this etching is anisotropic. In the diagrams, the favoured anisotropic etching direction is parallel to the axis Z.

This etching step is, for example, done in an inductive coupling plasma (ICP) reactor, or capacitive coupling plasma (CCP) reactor type etching equipment.

This plasma etching step is based on a chemistry comprising a fluorine (F)-based compound. Preferably, this chemistry comprises a fluorocarbon species, for example taken from among the following species: CxHyFz or CxHy, x, y and z being whole numbers. This etching chemistry has the advantage of improving the anisotropy of the etching. This anisotropy makes it possible to not etch the surfaces which are parallel to the favoured implantation direction. In the case of a FinFET transistor, the anisotropy of the etching makes it possible to not etch the dielectric layer 40 situated on the flanks of the grid 30 and intended to form the spaces of the transistor. The dimensional control of these spacers directly impacting the performances of the transistor, it is important to not involuntarily etch the dielectric layer 40 on the flanks of the grid 130.

Preferably, the fluorocarbon chemistry also comprises at least one additional dilution or dissociation species such as argon (Ar), helium (He), nitrogen (N) or oxygen (O).

The plasma can be continuous or pulsed.

Figure 3C:
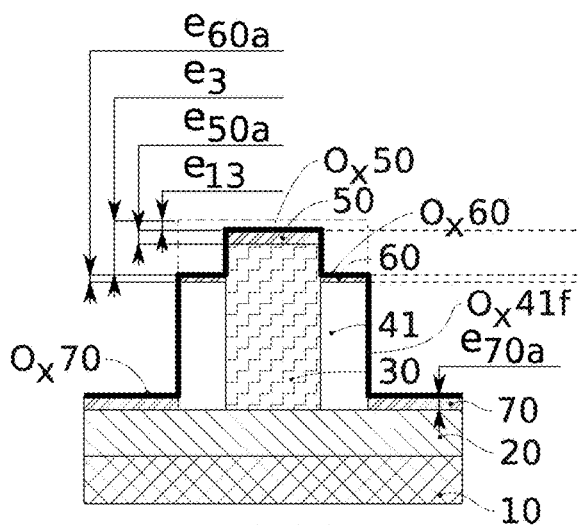
Figure 3D:
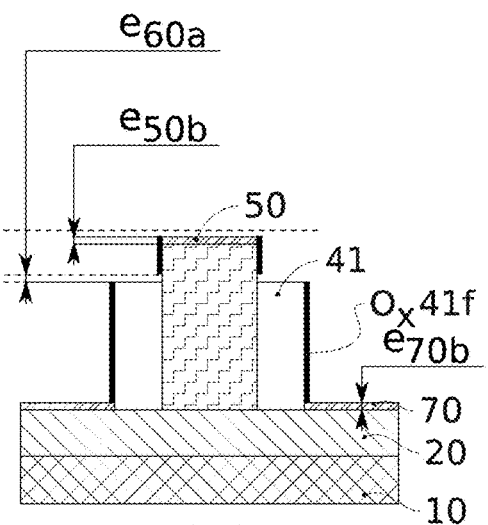
Figure 3E:
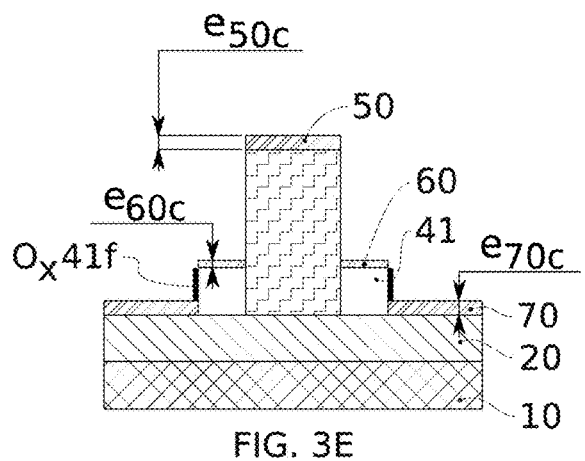
Figure 3F:
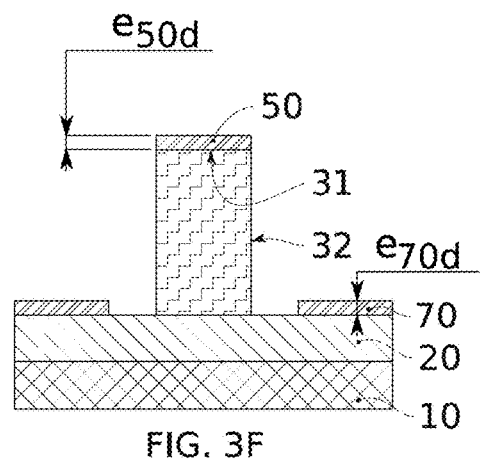

FIGS. 3C to 3E illustrate different steps of a step sequence which can be repeated until obtaining the result which is illustrated in FIG. 3F.

As illustrated in FIG. 3C, coming from the prior etching, or after the deposition of the dielectric layer 40 (in the case where there is no prior etching), a first etching of the dielectric layer 40 is done.

This first etching is configured so as to etch the dielectric layer 40 preferably to the material of the structure made of a semi-conductive material 30. Thus, coming from this first etching step, the etched thickness $e_3$ of the material of the dielectric layer 40 is greater than the etched thickness $e_{13}$ of the material of the semi-conductive layer 30.

Moreover, this etching is configured so as to:
  be interrupted before consuming all the thickness $e_{30}$ of the dielectric layer 40 situated on the flank 32 of the structure 30;
  form a first protective layer 50 on the top 31 of the structure 30 made of a semi-conductive material and to form a second protective layer 60 on an upper portion of the dielectric layer 40 situated on the flanks 32, the thickness $e_{50a}$ of the first protective layer 50 being greater than the thickness $e_{60a}$ of the second protective layer 60.

This first graving is preferably a plasma etching. This first etching of the dielectric layer 40 uses a chemistry comprising at least:
  one first fluorine (F)-based compound and
  one second compound taken from among $Si_wCl_{(2w+2)}$ and $Si_wF_{(2w+2)}$w, x, y and z being whole numbers,
  oxygen (O).

The first fluorine-based compound makes it possible for an effective etching of the dielectric layer 40 with a good anisotropy.

The second compound makes it possible to improve the selectivity of the etching of the dielectric layer opposite the underlying layers, for example, made of a semi-conductive or silicon oxide (SiO2) material.

Highly schematically in FIG. 3C, the thicknesses $e_3$ and $e_{13}$ illustrate this selective etching of the dielectric material opposite the semi-conductive material.

The quantity of the first fluorine-based compound is adjusted to as to consume all the fluorine-based compounds, and therefore to interrupt the first etching before consuming all the thickness (taken along the axis Z) of the dielectric layer 40 which is situated on the flanks 32. According to a particularly advantageous embodiment, the first fluorine-based compound has been fully introduced during the prior etching step illustrated in FIG. 3B. The fluorine subsisting from this etching step is used during said first etching until being fully consumed.

Alternatively, a part of all of the fluorine-based compounds consumed during this first etching is introduced in the plasma reactor during this first etching.

The presence of oxygen in the chemistry of the plasma makes it possible to oxidise the surface of the exposed layers. As long as there are compounds making it possible for the etching of the layers, typically the fluorine-based compound, the etching does not make it possible for the formation of an oxide layer. However, once the compounds making it possible for the etching have been fully consumed, the oxidation makes it possible for the formation of an oxide layer on the exposed surfaces. This oxidation forms referenced protective layers:

50 on the top 31 of the structure 30. This protective layer 50 is, for example, of SixOyFz type, if the structure 30 is silicon-based.

60 on the upper portions of the dielectric layer 40 situated on the flanks 32 of the Fin 30. This protective layer 60 is, for example, of SixOyNwFz type, of the dielectric layer 40 is SiN-based.

70 on the surface of the insulating layer 20. This protective layer 70 is, for example, of SixOyFz type, if the insulating layer 20 is SixOy-based.

The semi-conductive material is more reactive to oxygen than the dielectric material. It ensues that the thickness $e_{50}$ of the protective layer 50 formed on the top 31 of the structure 30 is greater than the thickness $e_{60}$ formed on the upper portion of the dielectric layer 40 situated on the flanks 32 of this structure 30.

Thus, the first protective layer 50 has a thickness $e_{50}$ greater than that $e_{60}$ of the second protective layer 60. Typically, $e_{50} \geq k1 \cdot e_{60}$, with k1=1.5 and preferably k1=2 and preferably k1=3.

Advantageously, the protective layer 70 formed on the surface of the insulating layer 20 has a thickness $e_{70a}$ greater than that $e_{60}$ of the protective layer 60 situated on the dielectric layer 40. Typically, $e_{70} \geq k2 \cdot e_{60}$, with k2=1.5 and preferably k2=2 and preferably k2=3.

Preferably, the chemistry used for this first etching also comprises dilution or dissociation species such as argon, helium or nitrogen.

The plasma can be continuous or pulsed. Generally, the pulsed plasma makes it possible to limit the damage of the semi-conductive material of the structure 30.

For example, during this etching, a chemistry comprising the following is used for the plasma:
CyHyFz, for example CH3F,
SiCl4 of which the flow is between 2 and 15 and preferably of around 5 sccm,
oxygen,
possibly a dissociation gas such as Ar, He or $N_2$.

Figure 4:
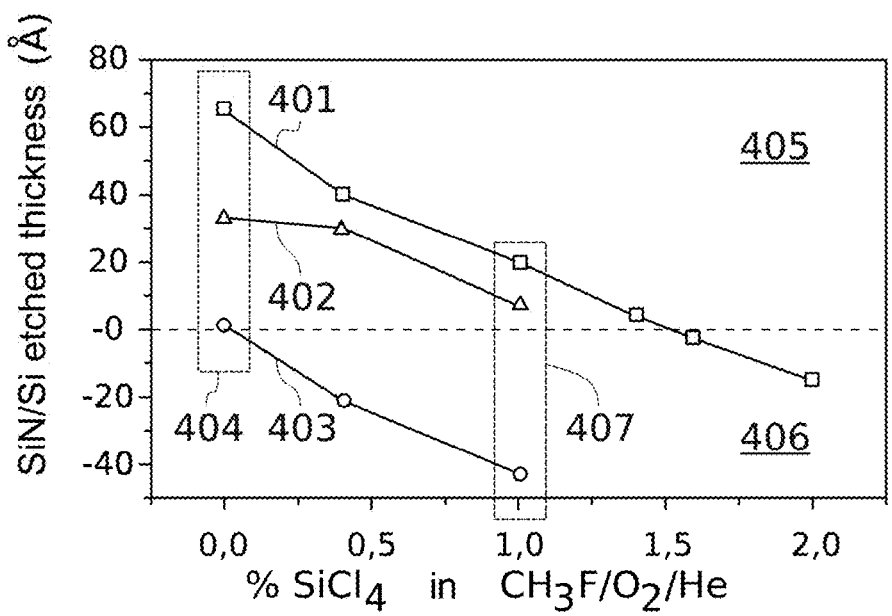
FIG. 4 is a graph illustrating the consumption of the dielectric layer and the consumption of the semi-conductive layer according to the presence of SiCl4 in the plasma.

FIG. 4 illustrates the consumption of the dielectric layer 40 and of the structure made of a semi-conductive material 30 according to the SiCl4 content of the plasma. In this example, the dielectric material is SiN and the semi-conductive material of the structure 30 is silicon. The gases injected in the plasma reactor, in addition to SiCl4 are the following gases: CH3F, O2 and He. The abscissa axis corresponds to the percentage of SiCl4 injected into the reactor, in terms of flow, with respect to the flow of other gases.

The zone 405 corresponds to an etching method and the zone 406 corresponds to a deposition method.

The curve 401 illustrates the etched thickness of the dielectric material. In correspondence with FIG. 3C, this is the thickness $e_3$.

The curve 402 illustrates the thickness of silicon consumed by increased etching of the thickness of the protective layer formed by the oxide on the top of the silicon structure. In correspondence with FIG. 3C, this is the thickness. This thickness is, for example, disclosed after the wet bath to remove the protective layer.

The curve 403 illustrates the thickness of silicon consumed by etching. For all these curves, the etching is preferably done with a pulsed plasma.

Under the conditions 404, the chemistry of the plasma does not contain any SiCl4. It thus appears that the consumption of silicon is significant (around 30 nm), with respect to the consumption of SiN (around 65 nm). Moreover, an almost zero thickness of protective layer made of oxide is formed.

Under the conditions 407, the chemistry of the plasma contains 1% SiCl4. It thus appears that the consumption of silicon is very low (around 8 Angström, that is 0.8 nm), while a good consumption of SiN is conserved (around 2 nm). Moreover, a significant thickness of protective layer made of oxide is formed (around 40 nm).

The conditions 407 thus make it possible to effectively etch the material of the dielectric layer 40, while very highly limiting the consumption of the layer made of semi-conductive material 30 and while forming a protective layer 50 thickness. FIG. 4 corresponds to a given method time. With a longer time, the SiN would continue to be etched, while the Si protected by the SiOx deposition would not be etched.

Figure 5:
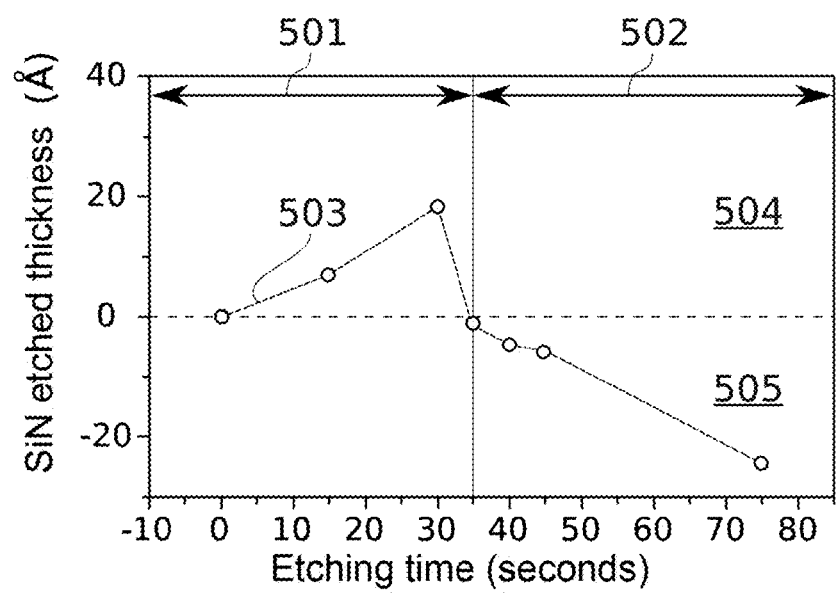
FIG. 5 is a graph illustrating the consumption of the dielectric layer as a function of time.

FIG. 5 illustrates the consumption of the dielectric layer 40 during the overetching time. The material as well as the chemistries used to establish the curve of FIG. 5 are identical to those used to establish the curves of FIG. 4.

The period 501 corresponds to a time period during which the gaseous mixture comprises fluorocarbon species and more generally at least one fluorine (F)-based compound. The period 502 corresponds to a time period during which the gaseous mixture no longer comprises any fluorine (F)-based compound. The zone 504 corresponds to an etching method and the zone 505 corresponds to a deposition method.

As appears in this FIG. 5, beyond a duration of 30 to 35 seconds, the dielectric layer 40 is no longer etched and the protective layer 60 made of oxide starts to be deposited on the nitride layer. It can be deduced that the species actively contributing to the etching, such as the fluorine (F)-based compound are no longer present in a sufficient quantity beyond this duration.

At the end of this duration, the first etching can therefore be interrupted, of which the result is illustrated in FIG. 3C, then the second etching can be implemented, of which the result is illustrated in FIG. 3D.

A person skilled in the art will know how to develop the curves of FIGS. 4 and 5 to determine the functioning conditions suitable for the materials and the thicknesses of the application thereof. Thus, they will know how to determine the SixCly or SixFy content in the mixture, as well as the etching time.

As illustrated in FIG. 3D, from the first etching, a second etching is done.

This etching aims to fully remove the second protective layer 60 situated on the upper portion of the dielectric layer 40 covering the flanks 32 of the Fins 30 while conserving a portion $e_{50b}$ of the first protective layer 50 on the top 31 of the Fins 30.

This aim is all the more easily achieved that the thickness $e_{50}$ of the first protective layer 50 is thicker than that $e_{60}$ of the second protective layer 60.

Moreover, during this step, also a portion $e_{70b}$ of the thickness of the protective layer formed above the insulating layer 20 is conserved.

This step is time-controlled.

This step mainly comprises an anisotropic etching. Typically, during the prior etching step, a thickness of at least 1 nm and preferably of at least 1 nm of the protective layer 50 is consumed.

Preferably, this thickness consumed during this second etching is less than 8 nm and preferably less than 4 nm and preferably less than 2 nm.

Preferably, this step is carried out such that the protective layer 50 conserved to protect the top 31 of the Fins has a residual thickness $e_{50b}$ such that $e_{50b} \geq 1$ nm and preferably $e_{50b} \geq 2$ nm. This thickness makes it possible to effectively protect the Fins 30.

It will be noted that, preferably, the first and/or second etchings are done so as to form a passivation layer on the exposed part of the flanks of the structure 30. This passivation layer, typically an oxide layer makes it possible to effectively protect these flanks against a bombardment which would not be perfectly anisotropic. This oxide film can be formed by the simple presence of oxygen in the chemistry of the plasma. For reasons of clarity and since it is very fine, compared with the oxide layers 50, 60, this oxide film is not represented in FIG. 3c onwards.

The second etching step preferably comprises a plasma etching done such that the etching is done along a favoured direction, parallel to the flanks of the grid. Thus, this etching is anisotropic. In the diagrams, the favoured anisotropic etching direction is parallel to the axis Z.

This etching step is, for example, carried out in an item of etching equipment of inductive coupling plasma (ICP) reactor type, or capacitive coupling plasma (CCP) reactor type.

This plasma etching step is based on a chemistry comprising a fluorine (F)-based compound. Preferably, this chemistry comprises a fluorocarbon species, for example, taken from among the following species: CxHyFz or CxHy, x, y and z being whole numbers, such as CF4 for example thus, the same chemistry can be used as for the prior etching step, preferably with a polarisation voltage (usually called bias) lower than during the prior etching, this in order to limit the consumption of the underlying layers, in particular of the layer made of semi-conductive material.

It is also possible to use SxFy-based chemistries, such as SF6. However, it is necessary to ensure that the etching with this type of chemistry is not too quick, in order to not damage the semi-conductive material layer.

Preferably, the fluorocarbon chemistry also comprises at least one additional dilution or dissociation species, such as argon (Ar), oxygen (O), helium (He) or nitrogen (N). Argon can have the disadvantage of making the etching speed too high. Typically, the thickness of the protective layer that is etched during this second etching step is less than 4 nm and preferably less than 2 nm. Typically, the etching speed of the protective layer is of around 10 nm/m.

This second etching step is interrupted, over time, after the whole protective layer 60 is consumed and before the whole protective layer 50 is consumed.

From this second etching step, the step sequence comprising the first etching step and the second etching step is repeated.

All throughout each sequence, the top 31 of the Fin 30 remains protected by the protective layer 50 formed by oxidation during the first etching step of each sequence. This is the same for the upper face of the insulating layer 20 which remains protected by the protective layer 70. During each first etching, the portions 41 of dielectric layer 40 covering the flanks 32 of the Fin 30, themselves have been highly consumed.

FIG. 3E illustrates the result of the first etching step of an additional sequence. It is seen in this FIG. 3E, that the height $e_{30}$ of the Fin 30 has not been consumed and that the top 31 of the Fin 30 is still covered by a protective layer 50. The portions 41 of dielectric layer 40 covering the flanks 32 of the Fin 30, themselves have been significantly consumed.

FIG. 3F illustrates the result that is obtained from a first etching step, even a second etching step, after having repeated the step sequence. As illustrated, the portions 41 of dielectric layer 40 covering the flanks 32 of the Fin 30 are fully consumed. However, the height $e_{30}$ of the Fin 30 has not been consumed or has only been very slightly consumed.

The top 31 of the Fin 30, as well as the upper face of the insulating layer 20 are still covered by protective oxide layers.

The protective layers 50, 70, and possibly 60 if it remains, can then be repeated. For this, a wet removal can for example be proceeded with, for example by using an HF (hydrofluoric acid) bath. In this case, it is possible that there is a slight consumption of the insulating layer 20, but the oxide-based protective layers 50, 60, 70 are etched quicker. Indeed, the oxide-based protective layers 50, 60, 70 are slightly dense through the deposition method thereof. They are thus etched a lot quicker than a BOX.

A non-limiting embodiment example will now be described.

The dielectric layer material is silicon nitride SiN. The semi-conductive material of the 3D structure (Fin 30 in this example) is silicon (Si).

The initial thickness $e_{30}$ of the Fin 30 is around 32 and 56 nm. The dielectric layer 40 has an initial thickness $e_{10}$ of between 8 and 12 nanometers, and of around 8 nm in this example.

The prior etching, of which the result is illustrated in FIG. 3B can be done by implementing the following conditions:

I. Prior Etching:

| | |
|---|---|
| Thickness $e_{12}$ of SiN conserved from the etching: | 2-3 nm |
| Thickness $e_{11}$ of etched SiN: | 6 nm |
| Chemistry: | CHF3: 30 sccm |
| | He: 220 sccm |
| Plasma type | ICP, CCP, pulsed or continuous |
| Power of the source: | 300 Watts |
| Polarisation voltage (bias): | 65 Volts |
| Pressure: | 5 milli Torr |
| Temperature of the support substrate: | 60° C. |
| Time: | 20 seconds |

II. Step Sequence:
First Etching:

| | |
|---|---|
| Chemistry: | CHF3: 200 sccm |
| | O2: 200 sccm |
| | He: 120 sccm |
| | SiCl4: 5 sccm |
| Plasma type | ICP, CCP |
| Pulsed plasma | 50% at 500 Hz |
| Power of the source: | 400 Watts |
| Polarisation voltage (bias): | 250 Volts |
| Pressure: | 10 to 100 milli Torr |
| Temperature of the support substrate: | 60° C. between 20° C. and 100° C. |

During this step, the plasma can be continuous or pulsed. A pulsed plasma makes it possible to more effectively limit the damage of the silicon layer. The frequency of the pulsed plasma is preferably of between 200 Hz and 5 kHz, preferably of around 500 Hz, with an activation rate of 10% to 90%, and typically of 50%.

Typically, during this first etching step, a thickness $e_3$ of SiN is etched on the flanks 32 of the Fin 30 of around 5 nm. A thickness $e_{13}$ of SiN is etched on the top 31 of the Fin 30 of around 5 nm.

Second Etching:

| | |
|---|---|
| Chemistry: | CF4: 50 sccm |
| | O2: 200 sccm |
| Plasma type | ICP, CCP |
| Plasma, possibly pulsed | Yes, 50% at 500 Hz |
| Power of the source: | 1200 Watts |
| Polarisation voltage (bias): | 50-100 V |
| Pressure: | 50-100 milli Torr |
| Temperature of the support substrate: | between 20° C. and 100° C. |

Typically, during this first etching step, the protective layer made of oxide is etched at a speed of around 10 nm/m.

Typically, during this step, the thickness of etched protective layer is less than 2 nm in this example. More generally, this thickness is less than 4 nm.

Optionally, before etching the dielectric layer 40, i.e. before the prior etching step if it is carried out or before the first sequence comprising the first and second etchings, a step of protecting the flanks of the dielectric layer 40 can be carried out. Indeed, during the different etchings, it is sought to etch the dielectric layer 40 along a direction Z perpendicular to the plane XY of the substrate 10. Thus, it can be advantageous to limit the lateral consumption (along the axis X) of the dielectric layer 40. For this, a protective layer can be formed, preferably by oxidation, on the dielectric layer 40. This oxidation is called initial oxidation.

According to another variant, at least one step sequence and preferably each sequence comprises an oxidation step, called main oxidation. This step is only optional.

FIG. 3C also illustrates the result of this main oxidation step. It is carried out, during said step sequence, after the first anisotropic etching and before the second anisotropic etching.

This step forms an oxide film 90 on all the uncovered surfaces.

This oxide film 90 is formed, in particular on the surfaces of the dielectric layer 40, 41 which cover the flanks 32 of the structure 30. This makes it possible to protect the dielectric layer covering the flanks 32 during the anisotropic etching steps. Indeed, it has proven to be, that despite the anisotropy of the etchings thereof, a part of the dielectric layer 40, 41 covering the flanks 32 can be involuntarily laterally consumed (i.e. along directions perpendicular to the favoured direction Z. The presence of this oxide layer prevents this involuntary lateral consumption of the dielectric layer 40, 41.

This lateral consumption, even low, can have major disadvantages. Indeed, in some zones, it is essential to perfectly control the thickness of the dielectric layer. Such is, for example, the case on the flanks of the grids of the transistors. A consumption, even low, of a part of the thickness of the spacers formed by this dielectric layer can significantly degrade the performances of the transistor.

This embodiment makes it possible to control, with even more precision, the size of the dielectric layer intended to inform the spacers. This embodiment therefore makes it possible to improve even more the performances of the microelectronic device.

The result of this optional main oxidation step is illustrated in FIG. 3C.

Thus, as appears in this FIG. 3C, the main oxidation is done so as to form an oxide film 90, having at least:

first portions Ox41f formed on the surface of the dielectric layer 40, 41 covering the at least one flank 32, the first portions Ox41f extending in a plane perpendicular YZ, ZX to the base plane XY on which rests the structure 30, at least one second portion Ox60 formed on said second protective layer 60 situated on the dielectric layer 40, 41 and having, projecting along the direction perpendicular Z to the base plane XY, a non-zero surface, third portions Ox50, Ox70 formed on the protective layers 50 and 70 and having, projecting along the direction perpendicular Z to the base plane XY, of the non-zero surfaces.

The second etching, of which FIG. 3D illustrates a result example, is done so as to:

have a favoured direction Z perpendicular to the base plane XY, fully remove said second portion Ox60 and said second protective layer 60 to uncover, along the direction perpendicular Z to the base plane XY, the dielectric layer 40, 41 situated under the second portion Ox60. Thus, during the sequence which will follow, the dielectric layer 41 could be etched by the first etching along the direction Z.

be stopped before laterally consuming, i.e. along a direction perpendicular to the direction Z, the dielectric layer 40, 41 situated on the flanks 32 of the structure 30. Preferably, the second etching is stopped before fully etching said first portions Ox41f formed on the surface of the dielectric layer 40, 41 covering the at least one flank 32. In this manner, it is ensured that the dielectric layer 40, 41 is not at all laterally consumed. This etching is time-controlled.

Thus, the oxide film Ox41f formed on the surface of the dielectric surface 40, 41 covering the flanks prevents any lateral consumption of the latter. The dielectric layer covering surfaces perpendicular to the base plane XY is therefore etched perfectly anisotropic, i.e. only along the favoured direction Z. The dimensional control of the thickness of the dielectric layer is therefore considerably improved.

When the 3D structure is intended to form a FinFET-type transistor, the present invention thus proposes an effective solution to etch the dielectric layer deposited on the Fins, while avoiding, even while removing the residue of dielectric layer outside of the Fins, as well as the consumption of layers underlying the dielectric layer such as the semi-conductive layer forming the Fin.

Moreover, the oxide film formed on the surface of the dielectric layer makes it possible furthermore to preserve the dimensional control of the spacers covering the flanks of the grid.

Thus, the method according to the invention provides, after each first anisotropic etching step, to form an oxide film 90 on the exposed surfaces. This oxide film 90 has a first portion Ox41f on the surface of the portions of the dielectric layer 40 covering the flanks 32 of the structure 30. This oxide film Ox41f extends over all the walls perpendicular to the base plane XY. This oxide film Ox41f thus protects these walls against any non-sought lateral consumption:
- during the second etching
- then possibly, according to the thickness of this film Ox41f subsisting from the second etching, during the first etching of the following sequence, which will have the aim of etching the dielectric layer along the favoured direction Z.

The method according to the invention makes it possible to protect these spacers during the main anisotropic etching which has the aim of consuming the dielectric layer outside of the zones of interest.

Typically, in the case of FinFET-type transistors, and as this has been indicated in the introduction, it is necessary to remove the dielectric layer on all the flanks of the Fin, while conserving the dielectric layer on the flanks of the grid.

The method according to the invention makes it possible to consume the dielectric layer perfectly anisotropically, i.e. along the favoured etching direction. It is therefore possible to remove all the height of the dielectric layer situated on the flanks of the Fin, to remove a corresponding height of the dielectric layer situated facing the hard mask surmounting the grid, without laterally etching the portion of the dielectric layer situated on the flanks of the grid.

Moreover, at each of the sequences, the first etching is stopped before etching the structure made of semi-conductive material 30.

Typically, if the dielectric layer 40 is made of $Si_xN_y$, thus the first portions Ox41f of the oxide film can be $Si_xO_yN_zF_t$, x, y, z, t, being whole numbers.

Typically, the thickness of the oxide film 90 is of between 2 and 4 nanometers.

This main oxidation step is preferably carried out in an item of etching equipment such as a plasma etching reactor. Preferably, the reactor is an ICP or CCP reactor. Preferably, this main oxidation step is carried out in the same reactor as the preceding steps.

The plasma making it possible for the oxidation is formed from an oxygen-based chemistry.

Figure 6:
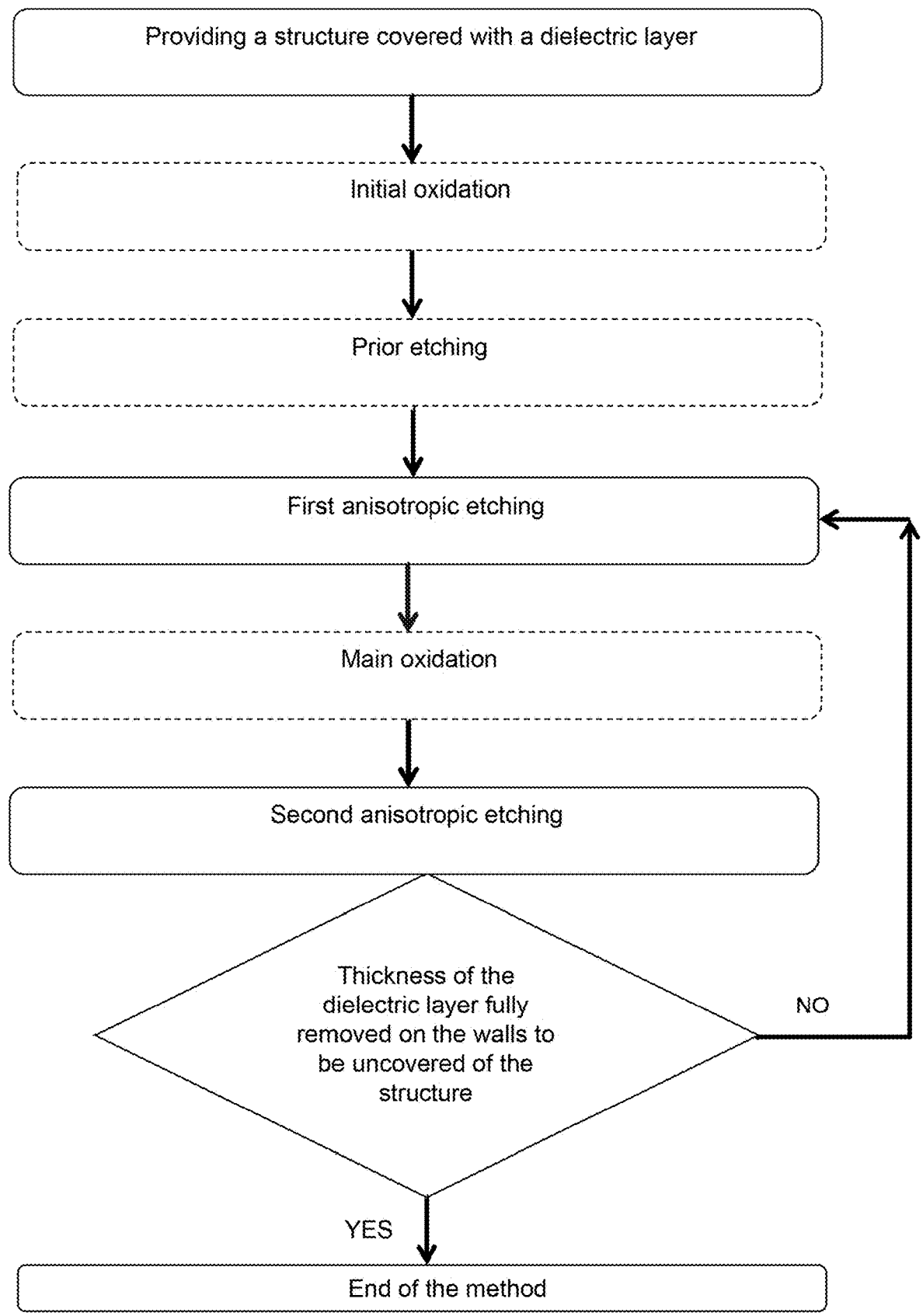
FIG. 6 illustrates the step sequence of a method example according to the invention.

Preferably, the polarisation voltage (usually called bias) is zero or very low in order to avoid damaging the semi-conductive material of the structure 30. More generally, the polarisation voltage is less than 50V and preferably less than 30V. The oxidation duration is preferably of between 5 and 30 seconds and preferably of between 10 and 20 seconds. FIG. 6 illustrates the main steps of an embodiment of the present invention. These steps are as follows:
- providing a structure covered with a dielectric layer,
- initial oxidation, this step being only optional,
- one or more iterations of a sequence comprising the following steps:
    - first anisotropic etching,
    - main oxidation, this step being only optional,
    - second anisotropic etching.

If all the thickness, taken along the direction Z of the dielectric layer is removed on the walls which are sought to be fully uncovered, thus the method is stopped. In the opposite case, i.e. if it subsists on the walls which are sought to be uncovered, a part of the dielectric layer, thus the step sequence is repeated.

A non-limiting example integrating a prior oxidation step in said step sequence will now be described.

The material of the dielectric layer is silicon nitride SiN. The semi-conductive material of the 3D structure (Fin 30 in this example) is silicon (Si). It will be noted that the following material to also be suitable for the example mentioned below, SiC, SiCN, or SiCBN.

The initial thickness $e_{30}$ of the structure made of semi-conductive material, typically a Fin of a FinFET transistor, is around 32 and 56 nm. The dielectric layer 40 has an initial thickness $e_{10}$ of between 8 and 12 nanometers, and around 8 nm in this example.

The prior etching, of which the result is illustrated in FIG. 3B can be done by implementing the following conditions:

I. Prior Etching (FIG. 3B):

| | |
|---|---|
| Thickness of SiN conserved from the etching: | 2-3 nm |
| Thickness $e_{11}$ of etched SiN: | 6 nm |
| Chemistry: | CHF3: 30 sccm |
| | He: 220 sccm |
| Plasma type | ICP, CCP, pulsed or continuous |
| Power of the source: | 300 Watts |
| Polarisation voltage (bias): | 65 Volts |
| Pressure: | 5 milli Torr |
| Temperature of the support substrate: | 60° C. |
| Time: | 20 seconds |

The step sequences of which the result is illustrated in FIG. 3D can be carried out by implementing the following conditions:

II. Step Sequence:

A. First Etching (FIG. 3C):

| | |
|---|---|
| Chemistry: | CHF3: 200 sccm or other gas of CxHyFz type |
| | O2: 200 sccm |
| | He: 120 sccm |
| | CH4: 0 to 20 sccm |
| | SiCl4: 5 sccm and more generally between 2 and 15 sccm |
| Plasma type | ICP, CCP |
| Pulsed plasma | Pulsed between 10% and 90%; preferably 50% |
| | at 200 Hz to 5 kHz, preferably 500 Hz |
| Power of the source: | 400 Watts |
| Polarisation voltage (bias): | 250 Volts |
| Pressure: | 10 to 100 milli Torr, preferably 90 milli Torr |
| Time: | Between 10 and 30 s, preferably 20 seconds |
| Temperature of the support substrate: | 60° C. between 20° C. and 100° C. |

During this step, the plasma can be continuous or pulsed. A pulsed plasma makes it possible to more effectively limit the damage of the silicon layer. The frequency of the pulsed plasma is preferably of between 200 Hz and 5 kHz, preferably of around 500 Hz, with an activation rate of 10% to 90% and typically 50%.

Typically, during this first etching step, a thickness of SiN is etched on the flanks 32 of the Fin 30 of around 5 nm. A thickness of SiN is etched on the top 31 of the Fin 30 of around 5 nm.

B. Main Oxidation (FIG. 3C):

| | |
|---|---|
| Type of dielectric layer 40 | SiN |
| Type of semi-conductive structure 30 | Si |
| Thickness of the oxide film 90 formed by oxidation | 2 to 4 nm, for example |
| Chemistry: | O2: 200 sccm |
| Plasma type | ICP, CCP, pulsed or continuous |
| Power of the source: | 1000 Watts |
| Polarisation voltage (bias): | 0 Volts |
| Pressure: | 10 milli Torr |
| Temperature of the support substrate: | 50° C. |
| Time: | 10 seconds |

A zero polarisation voltage makes it possible to avoid, or at least limit the silicon consumption situated under the dielectric layer.

C. Second Anisotropic Etching (FIG. 3D):

| | |
|---|---|
| Chemistry of the plasma: | CHF3: 30 sccm |
| | He: 220 sccm |
| Plasma type | ICP |
| Power of the source: | 300 Watts |
| Polarisation voltage (bias): | 65 Volts |
| Pressure: | 5 milli Torr |
| Temperature of the support substrate: | 60° C. |
| Time: | 3 seconds |

As an alternative, the conditions of the following table can also be applied:

| | |
|---|---|
| Chemistry of the plasma: | CH2F2: 95 sccm |
| | O2: 63 sccm |
| | He: 50 sccm |
| | CH4: 20 sccm |
| Plasma type | ICP |
| Power of the source: | 400 Watts |
| Polarisation voltage (bias): | 100 Volts |
| Pressure: | 40 milli Torr |
| Temperature of the support substrate: | 60° C. |
| Time: | 30 seconds |

Preferably, all the steps of this embodiment are carried out in the same plasma reactor, which makes it possible to reduce the production cycles, and to reduce the cost of implementing the method.

The embodiment which has been described in detail above, in reference to FIGS. 3A to 3F and 6, makes it possible to quickly etch the dielectric layer along the favoured etching direction, while controlling with a great, also improved precision of the dimensional control of the dielectric layer intended to form the grid spacers.

In the case of the embodiment of a FinFET transistor, it is sought to conserve the dielectric layer 40 on the flanks of the grid 130 while fully removing the dielectric layer 40 on the Fins 30. Yet, the flanks of the grid 130 and the flanks 32 of the Fin 30 are generally perpendicular to the main plane XY of the support substrate 10 and are generally parallel to the main direction (Z) for implanting ions coming from the plasma. In order to avoid consuming the dielectric layer on the flanks of the grid 130 during the removal of this same layer on the flanks of the Fins 30, it is provided that the thickness $e_{150}$ of the hard mask 150 surmounting the grid 130 is greater than or equal to the thickness $e_{30}$ of the Fin 30. Thus, when the dielectric layer 40 covering the flanks 32 of the Fin 30 will be fully consumed, the dielectric layer 40 will have been consumed on one part at least of the thickness of the hard mask, but will continue to fully cover the flanks of the grid 130.

In view of the description above, it clearly appears that the present invention proposes an effective solution to fully etch and with a great precision, the dielectric layer on the top and the faces of a 3D structure while avoiding damaging this 3D structure. Typically, the etching of the dielectric layer is done with an atomic precision or precision close to the etched single layer.

The invention is not limited to the embodiments described above and extends to all the embodiments covered by the claims.

For example, the method cannot comprise the prior etching step. Thus, the etching of the dielectric layer is only done by sequences comprising the first and second etchings.

Although it has, as a particularly advantageous application, the embodiment of FinFET-type transistors, the invention is applied to all etchings of a dielectric layer having a three-dimensional structure. Thus, it will have an application in the production of nanowires, for example, and in particular stacked nanowires.

The invention claimed is:

1. A method for etching a dielectric layer covering at least one top and at least one flank of a semi-conductive material-based structure, the method comprising a plurality of sequences, each sequence of which comprising at least the following successive steps:
   a first etching of the dielectric layer, by plasma, using a chemistry comprising at least:
      at least one first compound being fluorine-based and from dissociation of at least one compound taken from among fluorocarbon compounds,
      at least one second compound chosen from among $Si_wCl_{(2w+2)}$ and $Si_wF_{(2w+2)}$, where w, x, y, and z are whole numbers, and
      oxygen,
   the first etching being performed so as to:
      generate an ionic bombardment directed mainly along a direction parallel to the at least one flank,
      adjust a quantity of the at least one first compound to consume a whole of the fluorine-based compound during the first etching, so as to interrupt the first etching before consumption of all of a thickness of the dielectric layer disposed on the at least one flank and after having consumed all of a thickness of the dielectric layer disposed on the at least one top, and
      form a first protective layer by oxidising an upper portion of the at least one top of the structure, and form a second protective layer by oxidising an upper portion of the dielectric layer disposed on the at least one flank, a thickness of the first protective layer being greater than a thickness of the second protective layer; and
   a second etching to fully remove the second protective layer while conserving a portion of the thickness of the first protective layer,
   said each sequence being repeated until the dielectric layer disposed on the at least one flank of the structure is completely removed.

2. The method according to claim 1, further comprising a prior step of depositing the dielectric layer on the structure, wherein the deposition of the dielectric layer is a conformal deposition.

3. The method according to claim 1, further comprising a prior step of etching the dielectric layer, performed before said each sequence, the prior step of etching being interrupted so as to conserve a portion of the dielectric layer disposed on the at least one top of the structure.

4. The method according to claim 3, wherein the prior step of etching of the dielectric layer is based on a fluorocarbon chemistry.

5. The method according to claim 3, wherein the prior step of etching is interrupted by controlling an etching time, such that an etched thickness of the dielectric layer during the prior step of etching is such that $0.95*e_{10} \geq e_{11} \geq 0.7*e_{10}$, where $e_{10}$ is a thickness of the dielectric layer before etching by the prior step of etching, and where $e_{11}$ is the etched thickness of the dielectric layer.

6. The method according to claim 5, wherein $e_{10} \geq 6$ nm.

7. The method according to claim 3, wherein the portion of the dielectric layer conserved from the prior step of etching has a thickness greater than or equal to 2 nm.

8. The method according to claim 3, wherein the at least one first compound being fluorine-based comes from a chemistry used during the prior step of etching.

9. The method according to claim 1, wherein the second etching is an etching based on a fluorinated or fluorocarbon chemistry.

10. The method according to claim 1, wherein the second etching is time-controlled, so as to fully remove the second protective layer and to conserve the portion of the thickness of the first protective layer.

11. The method according to claim 1, wherein the structure is made of a material chosen from among silicon, germanium, and silicon-germanium.

12. The method according to claim 1, wherein the structure forms a channel of a FinFET transistor.

13. The method according to claim 1,
wherein the structure is disposed on a support substrate, and
wherein the at least one flank extends along a plane that is perpendicular to a main plane along which the support substrate extends.

14. The method according to claim 1, wherein the structure is formed by at least one block of the semi-conductive material or by at least one strip of the semi-conductive material.

15. The method according to claim 1, wherein the structure is formed by a layer having a three-dimensional shape.

16. A method for producing a FinFET transistor surmounting a support substrate, the FinFET transistor comprising a grid and at least one channel passing through the grid and extending from a flank of the grid to form at least one structure of a semi-conductive material, the at least one structure having a top and at least two flanks, the method comprising:

depositing a dielectric layer covering the grid and the at least one structure; and
etching the dielectric layer by implementing the method according to claim 1, so as to completely remove the dielectric layer disposed on the at least one structure of the semi-conductive material.

17. The method according to claim 16, wherein the FinFET transistor has a hard mask covering a top of the grid, the dielectric layer being deposited on the hard mask, the hard mask having a thickness such that $e_{150} \geq e_{30}$, where $e_{150}$ is the thickness of the hard mask, and $e_{30}$ is a thickness of the at least one structure of the semi-conductive material.

18. The method according to claim 16,
wherein the at least two flanks extend into planes (YZ, ZX) that are perpendicular to a base plane (XY) on which the at least one structure of the semi-conductive material is disposed, the top of the at least one structure having a non-zero surface projecting along a direction (Z) that is perpendicular to the base plane (XY), and
wherein at least one of said each sequence comprises, after the first etching and before the second etching, an oxidation step to form an oxide film over all of exposed surfaces.

19. The method according to claim 18, wherein:
said oxidation step is performed such that the oxide film has at least:
first portions formed on a surface of the dielectric layer covering the at least two flanks, the first portions extending into the planes (YZ, ZX) that are to the base plane (XY), and
at least one second portion formed on the second protective layer disposed on the dielectric layer and having the non-zero surface projecting along the direction (Z) that is perpendicular to the base plane (XY), and
the second etching being performed so as to:
have a favoured direction, which is the direction (Z) that is perpendicular to the base plane (XY),
fully remove the at least one second portion and the second protective layer to uncover, along the direction (Z), the dielectric layer disposed under the at least one second portion, and
be stopped before fully consuming the first portions formed on the surface of the dielectric layer covering the at least two flanks.

* * * * *